United States Patent [19]

Hasegawa et al.

[11] 4,240,038

[45] Dec. 16, 1980

[54] PREAMPLIFIER

[75] Inventors: Kenichi Hasegawa, Neyagawa; Hiroshi Taniguchi, Hirakata; Sadafumi Kitamura, Neyagawa, all of Japan

[73] Assignee: Matsushita Electric Industrial Co., Ltd., Osaka, Japan

[21] Appl. No.: 885,513

[22] Filed: Mar. 13, 1978

[30] Foreign Application Priority Data

Mar. 23, 1977 [JP] Japan .................................. 52/32453

[51] Int. Cl.³ .......................... H03F 1/26; H04N 5/76
[52] U.S. Cl. .................................... 330/149; 330/107; 358/8; 358/127
[58] Field of Search .................. 179/1 P, 1 F; 330/80, 330/103, 149, 294, 291, 108; 358/8, 127

[56] References Cited

U.S. PATENT DOCUMENTS

| 1,709,360 | 4/1929 | Mayer | 330/108 X |
| 1,941,385 | 12/1933 | Bowles | 179/1 F |
| 2,319,663 | 5/1943 | Crowley | 330/108 |
| 3,243,511 | 3/1966 | Erdman et al. | 330/303 X |

FOREIGN PATENT DOCUMENTS 1067485 10/1959 Fed. Rep. of Germany ...... 330/291 X

Primary Examiner—James B. Mullins
Attorney, Agent, or Firm—Burgess, Ryan and Wayne

[57] ABSTRACT

In a circuit including an amplifier for amplifying a small signal from a signal source wherein the inductance of a transducer and the capacitance of a capacitor form a resonance circuit, the output from the amplifier is negatively fed back through a resistor or a combination of resistors to the input of the amplifier, whereby the noise in the demodulated signal may be suppressed.

6 Claims, 12 Drawing Figures

PREAMPLIFIER

BACKGROUND OF THE INVENTION

The present invention relates to a preamplifier for amplifying a small signal from a transducer having an inductive signal source impedance with an improved signal-to-noise ratio S/N of the signal demodulated from the amplified signal and more particularly a preamplifier especially adapted for use in a system for recording and reproducing angularly modulated television signals.

A preamplifier in a home type video tape recorder consists of an amplifier with an input terminal grounded through a parallel circuit of a resistor and a capacitor connected to a magnetic head. The inductance of the magnetic head and the capacitor form a parallel resonant circuit, and the resistor serves as a damping resistor of resonant circuit. The gain of the amplifier is maximum at the resonant frequency fr of the resonance circuit.

The demands upon the performance of this preamplifier will become apparent from the following description of the process for recording and reproducing the television signal. When the sinusoidal waveforms recorded on the magnetic tape and reproduced across the magnetic head, the maximum output voltage is obtained at the frequency fo (approximately 1 MHz or less) which is dependent upon the gap width of the magnetic head and the relative velocity between the magnetic tape and head.

Since the bandwidth of the video signal of the television signal is 3 MHz, the bandwidth of 3 MHz is also required in the frequency modulation of the video signal when the latter is recorded. Therefore the resonant frequency of the resonant circuit of the preamplifier is set at 5 MHz so that the output voltage-frequency characteristic curves of the preamplifier may be made flat. In general, the upper and lower limits of the bandwidth in the frequency modulation of the video signal are 4.5 MHz and 3.5 MHz, respectively, and the frequency modulation is made in such a way that the sync clip level may have a low frequency while the white level may have a high frequency. The carrier and the lower sideband are recorded on the magnetic tape, but the upper sideband is only partially recorded. When the video signal is reproduced with a video tape recorder with a narrow bandwidth, a peculiar phenomenon called "reversal" tends to result. In order to avoid this phenomenon, the resonant frequency fr is set higher than the upper limit (4.5 MHz).

As a result of ever improving magnetic recording and reproducing techniques, information or data may now be recorded on magnetic tape at an extremely high density. Consequently, while by the EIAJ (Electronic Industrial Association of Japan) standards, the relative velocity between the magnetic head and tape and the track width were 11 m/sec and 120 μm respectively, the standards for recently developed devices are 6 m/sec and 30 μm, respectively. This means that the recording density per unit area on the magnetic tape has been increased by 8 times as high as before. However, the slower the relative velocity and the shorter the track width, the lower the signal voltage reproduced across the magnetic head becomes. Even though the decrease in output voltage has been avoided by the improvements of the magnetic tapes and heads to some extent, it results in serious degradation of the signal-to-noise ratio S/N as will be described below.

First, in order to obtain a high S/N ratio with a low output voltage, noise must be suppressed as much as possible. However, the causes and nature of noise produced in a system consisting of a magnetic tape, a magnetic head and a preamplifier had not been thoroughly investigated and analyzed. Furthermore the impedance of the signal source including the magnetic head varies in response to the frequency. As a result, very complex yet unsatisfactory methods had been used in determining the noise factor NF of the preamplifiers.

So far the dominant noise was the so-called modulation noise from a system including a magnetic head and a magnetic tape. The lower the level of the reproduced signal, the less the modulation noise becomes as the results of the extensive studies and experiments conducted by the inventor prove. Since the modulation noise contains many amplitude modulated components, the modulation noise may be suppressed to some extent by passing the signal through a limiter prior to the frequency modulation.

Therefore the inventors made extensive studies and experiments in order to clarify the source of noise which greatly influences the signal-to-noise ratio S/N in the signal frequency demodulated from the signal reproduced from the magnetic tape upon which the signals have been recorded at a high density, and the inventors have succeeded in finding out the cause of noise and means for eliminating it or suppressing it as much as possible, to an extent hitherto unattainable by conventional preamplifiers.

SUMMARY OF THE INVENTION

Accordingly, one of the objects of the present invention is to reduce the noise components in the upper and lower sidebands of the output signal from a limiter circuit so that the noise in the demodulated signal may be reduced. Therefore, the variation in signal-to-noise ratio S/N of the demodulated signal in response to the d-c component level of the demodulated signal (which corresponds to the white level, the gray level or the black level in case of the video signal) may be minimized.

To the above and other ends, according to the present invention, the output from a preamplifier is negatively fed back through a resistor to the input of the amplifier, whereby the gain in the vicinity of the resonance frequency of a resonance circuit formed by the inductance of a transducer and the capacitance of a capacitor may be controlled by the damping effect and the noise components in the vicinity of the resonance frequency may be considerably suppressed.

BRIEF DESCRIPTION OF THE DRAWINGS

FIG. 1 (b) is an equivalent circuit diagram thereof;

FIG. 5 (b) is an equivalent circuit of the circuit shown in FIG. 3 (a).

DESCRIPTION OF THE PREFERRED EMBODIMENTS

Prior Art

Figure 1A:
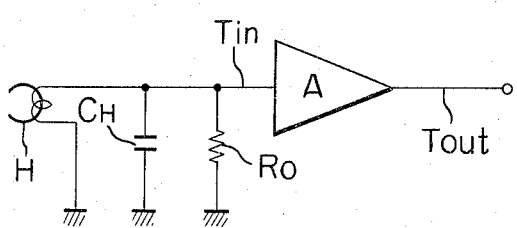
FIG. 1 (a) is a diagram of a prior art preamplifier.
Figure 1B:
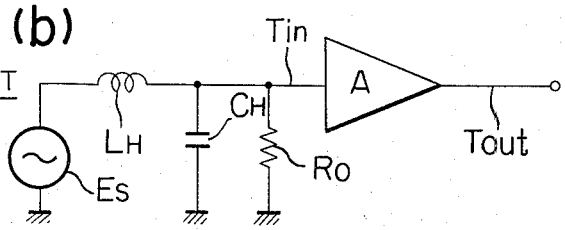
Figure 2A:
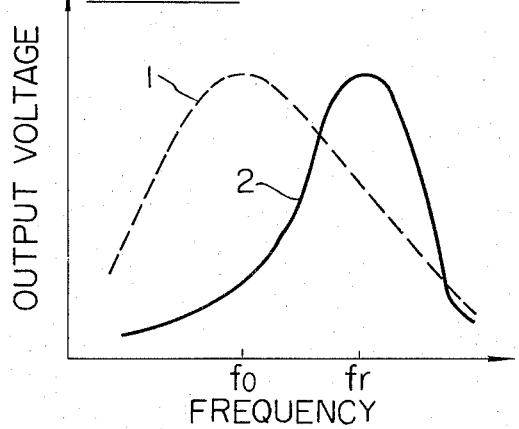
FIGS. 2 (a), (b) and (c) show the output voltage-frequency characteristic curves used for the explanation of the prior art preamplifiers and preferred embodiments of the present invention.
Figure 2C:
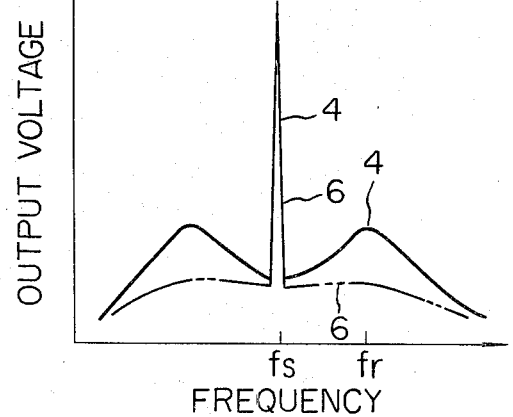
Figure 2B:
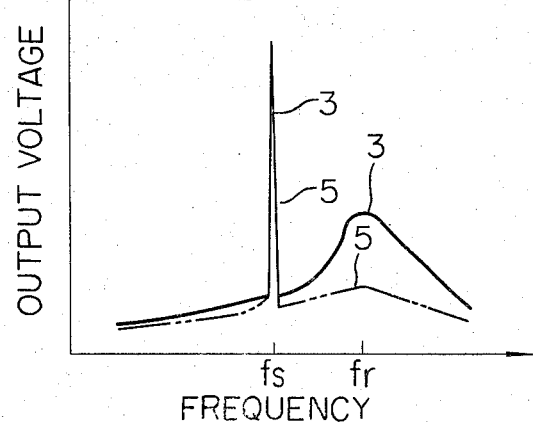

Prior to the description of the preferred embodiments of the present invention, an example of preamplifiers will be described. FIG. 1 (a) shows a typical example of a preamplifier employed in the home type video tape recorders. The video signal reproduced through a magnetic head H from a magnetic tape is applied to an input terminal Tin of an amplifier A. One ends of a resistor Ro and a capacitor $C_H$ are connected to the input terminal Tin while the other ends are grounded. FIG. 1 (b) shows an equivalent circuit of the circuit shown in FIG. 1 (a). Inductance $L_H$ of the magnetic head H and capacitance $C_H$ form a parallel resonance circuit, and the resistor Ro functions as a damping resistor for this resonance circuit or system. The gain-frequency characteristic curve 2 of this circuit is shown in FIG. 2 (a). The highest gain is obtained at the resonance frequency fr.

The broken line curve 1 in FIG. 2 (a) shows the output voltage vs. frequency characteristic curve when the sinusoidal waveforms recorded on the tape are reproduced. The maximum output voltage is obtained at a frequency fo which is dependent upon a gap width of the magnetic head and the relative velocity between the magnetic head and the tape. In general, the frequency fo is approximately 1 MHz or less.

The bandwidth of the video signal is 3 MHz so that the 3 MHz bandwidth is also required for frequency modulation. Therefore the resonance frequency fr of the resonance system of the preamplifier is approximately set to 5 MHz, and the output voltage from the preamplifier is flattened against the variation in frequency. In the frequency modulation of the video signal, the upper and lower limits of the frequency deviation are selected in general 4.5 MHz and 3.5 MHz, respectively, and the frequency modulation is made in such a way that the sync chip level may have a low frequency and the white level may have a high frequency. While the carrier and the lower side band are recorded on the magnetic tape, almost all the upper side band is lost.

As described elsewhere, in the video tape recording with a narrow bandwidth the resonance frequency is so that the output voltage vs. frequency characteristic may be corrected and that "the reversal" may be avoided. However, the frequency fs of the signal reproduced across the magnetic head is in general lower than the resonance frequency; that is, $fs \leq fr$ so that the noise is produced. As described above, the gray and black levels have frequencies lower than the frequency of the white level in the frequency modulated video signal so that the gray and black levels are more adversely affected by the noise than the white level. It had not been made clear yet where the noise which becomes maximum in the proximity of the resonance frequency fr is, and it had been considered that the noise is due to the impedance of the magnetic head. However, the inventors have found out that the major cause of noise is due to the damping resistor in the resonance circuit as will be described below.

Referring back to FIG. 1 (b), the noise is due to the real component of the impedance of the resonance circuit consisting of inductance $L_H$, capacitance $C_H$ and resistance Ro, and becomes maximum at the resonance frequency fr.

The degradation of the signal-to-noise ratio after frequency demodulation results because of the reasons described below. Referring to FIG. 2 (b), the output voltage-frequency characteristic curve 3 is obtained when the video signal at fs is reproduced across the magnetic head and amplified by the preamplifier. The components in the upper and lower sidebands are noise, and the noise becomes maximum in the vicinity of the resonance frequency fr. When the signal containing such noise [with the characteristic curve 3 in FIG. 2 (b)] is made to pass through a limiter for processing the signal prior to the frequency demodulation, the characteristic curve 4 as shown in FIG. 2 (c) is obtained. The noise output reaches its peaks in the upper and lower sidebands. This is similar to the phenomenon observed in vestigial sideband transmission wherein when the carrier and one vestigial sideband are made to pass through a limiter circuit, the other vestigial sideband is reproduced. When such signal (with the characteristic curve 4 in FIG. 2c) is frequency modulated, the noise is increased. When the video signal is recorded or reproduced with the resonance circuit with the resonance frequency fr, the specific phenomenon called "reversal" tends to result. In order to avoid this phenomenon, the resonance frequency fr must be set higher than the upper limit about 4.5 MHz.

With the ever increasing recording density of the magnetic recording-reproducing equipment, the EIAJ standards have been so revised that the relative velocity between the magnetic head and tape and the track width are defined 6 m/sec and 30 μm which were 11 m/sec and 120 μm. in other words, the recording density per unit area on the magnetic tape has been increased by approximately 8 times. However, the slower the relative velocity and the shorter the track width, the lower the voltage of the signal reproduced across the magnetic head becomes. The considerable reduction in output voltage which is compensated to some extent by the improvements of the magnetic tapes and heads results in the degradation in S/N ratio which adversely affects the magnetic recording and reproducing systems as will be described below.

Since the output voltage is decreased, the noise must be suppressed as much as possible in order to obtain a high S/N ratio. However, so far the cause of noise from magnetic tapes and heads and preamplifiers have not been thoroughly investigated, and the impedance of the signal source or the reproduced video signal varies in response to the frequency thereof so that the circuit designs for selecting optimum noise frequency have not been available and have been extremely complex. Furthermore the major noise had been the so-called modulation noise produced from the system consisting of the magnetic tape and head, but as the output level of the reproduced signal is reduced, the modulation noise is also decreased. (This has been confirmed by the experiments conducted by the inventors.) However, since the modulation noise has many amplitude modulated components, it may be reduced to some extent with a limiter preceding to a frequency demodulation stage.

Thus, there had been a strong demand for clarifying the source of noise which dominantly adversely affects the signal-to-noise ratio S/N in case of the frequency demodulation of the signal recorded in a high density and for means for eliminating or suppressing the noise.

Figure 3A:
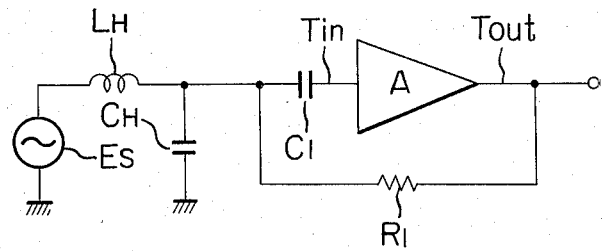
FIGS. 3 (a), (b) and (c) and FIGS. 4 (a) and (b) are circuit diagrams of the preferred embodiments of the present invention.
Figure 3B:
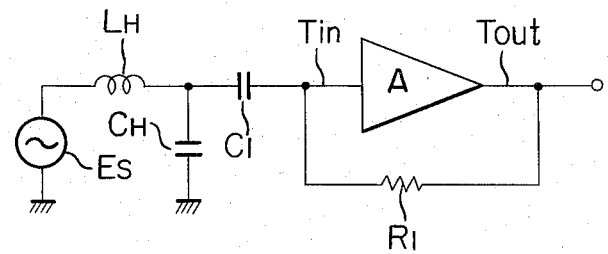
Figure 3C:
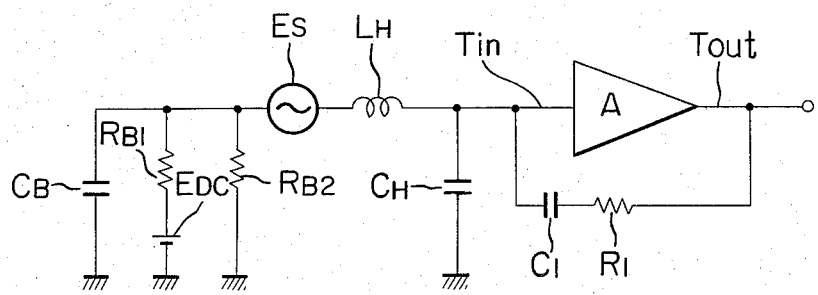
Figure 4A:
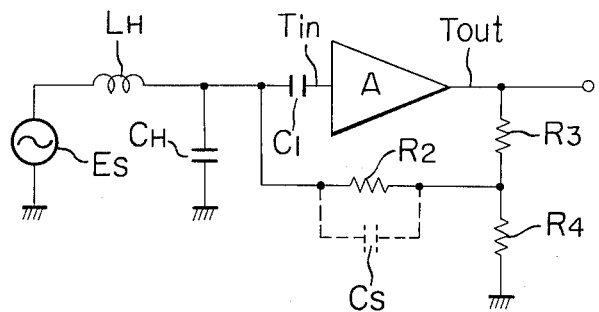
Figure 4B:
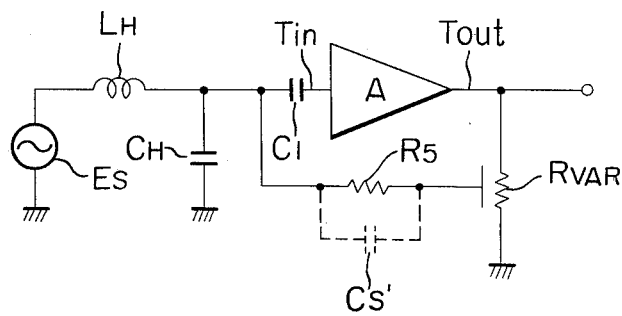
Figure 5A:
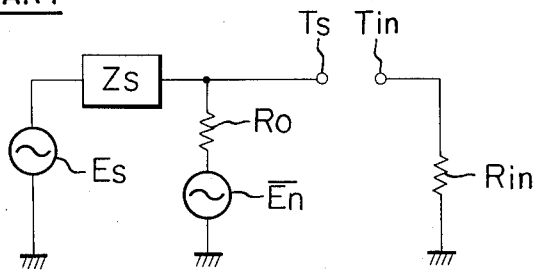
FIG. 5 (a) is an equivalent circuit redrawn from the equivalent circuit in FIG. 1 (b)
Figure 5B:
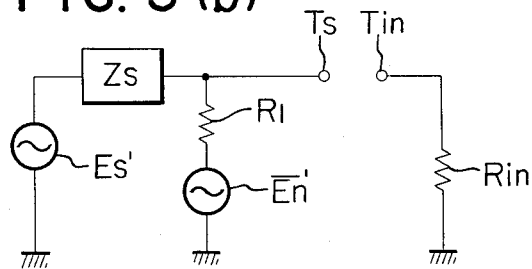

THE INVENTION, FIGS. 3, 4 and 5

Referring first to FIG. 3 (a), $L_H$ is the inductance of the magnetic head and Es is the signal induced across the magnetic head. The capacitance $C_H$ and the inductance $L_H$ form a resonance circuit. A capacitor $C_1$ is connected in order to avoid the direct current flow between the amplifier A and the resonance circuit, and $R_1$ is a feedback resistor. A first amplifier stage in the amplifier A is d-c biased. The signal applied to the input terminal Tin of the amplifier is amplified with a gain or an amplification factor a (a > +1), inverted in phase and appears at the output terminal Tout.

The feedback factor $\beta$ is $$\frac{|Zin|}{R_1 + |Zin|}$$

wherein Zin = the parallel impedance of the impedance Zs of the resonance circuit and the input impedance Rin of the amplifier. When viewed from the magnetic head to the amplifier A, the resistor $R_1$ is a negative feedback resistor so that it equals to $$\frac{R_1}{1 + a}$$

The resistor is interconnected between the input terminal Tin and the ground in parallel with the impedance Zs and Rin so that the resistor $R_1$ becomes same with the resistor Ro in the circuit shown in FIG. 1 (b). Therefore, $$R_1 = (1+a) Ro.$$

The difference between the circuit shown in FIG. 3 (a) and the circuit shown in FIG. 1 (b) will be described below with reference to FIGS. 5 (a) and 5 (b). FIG. 5 (a) shows an equivalent circuit including the noise source of the circuit shown in FIG. 1 (b). The signal voltage Es' with the frequency fs induced across the magnetic head is transmitted to the terminal Ts through the impedance Zs, i.e. the resonance circuit consisting of $L_H$ and $C_H$. (Es' = a proportionality factor × the voltage Es because the circuit shown in FIG. 1 (b) is redrawn as shown at (a) and (b) in FIG. 5.) The damping resistor Ro is interconnected between the terminal Ts and a voltage source $\overline{En}$ which represents the thermal noise produced by the resistor Ro. The signal and noise are transmitted from the terminal Ts to the input terminal Tin, and a voltage is obtained across an input resistor Rin of the amplifier A. The signal with the frequency fs at the terminal Ts is $$Es' \times \frac{Ro}{|Zs(fs)| + Ro}$$

and the noise $\overline{En}$ due to the resistor Ro which has a peak in the vicinity of the resonance frequency fr is $$\sqrt{4 K T Ro \cdot \Delta f} \times \frac{|Zs(fr)|}{Ro + |Zs(fr)|}$$

where Zs(fs) and Zs(fr) are impedance Zs at fs and fr, K = Boltzman's (constant),
T = temperature of the resistor, and
$\Delta f$ = a narrow frequency band in the vicinity of the frequency fr.

The ratio of the signal at fs to the noise in the vicinity of fr is $$\text{Ratio} = \frac{Es' \times \frac{Ro}{|Zs(fs)| + Ro}}{\sqrt{4 K T Ro \cdot \Delta f} \times \frac{|Zs(fr)|}{Ro + |Zs(fr)|}}$$

$$= \frac{Es'}{\sqrt{4 K T Ro \cdot \Delta f}} \times \frac{Ro}{|Zs(fr)|} \times \frac{Ro + |Zs(fr)|}{Ro + |Zs(fs)|}$$

FIG. 5 (b) shows an equivalent circuit including a noise source of the circuit shown in FIG. 3 (a). $\overline{En'}$ is the thermal noise of the resistor $R_1$. The signal at the terminal Ts is $$Es' \times \frac{R_1}{|Zs(fs)| + R_1}$$

and the noise at the terminal Ts is $$\sqrt{4 K T R_1 \cdot \Delta f} \times \frac{|Zs(fr)|}{R_1 + |Zs(fr)|}$$

The ratio between them is $$\text{Ratio}' = \frac{Es'}{\sqrt{4 K T R_1 \cdot \Delta f}} \times \frac{R_1}{|Zs(fr)|} \times \frac{R_1 + |Zs(fr)|}{R_1 + |Zs(fs)|}$$

Inserting into this ratio $R_1 = (a+1)Ro$ and dividing it by the ratio obtained in the circuit shown in FIG. 5 (a), we have $$\frac{\text{Ratio}'}{\text{Ratio}} = \frac{\sqrt{4 K T Ro \Delta f}}{\sqrt{4 K T R_1 \Delta f}} \times \frac{R_1}{Ro}$$

$$\times \frac{\{R_1 + |Zs(fr)|\} \{Ro + |Zs(fs)|\}}{\{R_1 + |Zs(fs)|\} \{Ro + |Zs(fr)|\}}$$

$$= \sqrt{a + 1} \times \frac{\{R_1 + |Zs(fr)|\} \{Ro + |Zs(fs)|\}}{\{R_1 + |Zs(fs)|\} \{Ro + |Zs(fr)|\}}$$

In practice, the magnetic head has resistive loss, and the absolute value of the impedance Zs of the resonance circuit consisting of the inductance $L_H$ of the magnetic head and the capacitance $C_H$ is in general $$Ro \approx |Zs| \text{ or } Ro > |Zs|$$

The absolute value of the gain a of the amplifier A is $$a > +1$$

(In practice, a = 10 to 1000).
Hence, $$R_1 = (a+1)Ro > |Zs|$$

Therefore, $$\frac{\text{Ratio}'}{\text{Ratio}} \approx \sqrt{a + 1} \times \left\{ 1 + \frac{|Zs(fs)| - |Zs(fr)|}{Ro + |Zs(fr)|} \right\}$$

In the second term, $$|Zs(fr)| > |Zs(fs)|$$

since the resonance frequency is fr.
Therefore, $$\frac{\text{Ratio}'}{\text{Ratio}} = \sqrt{a+1} \times \{1 + \frac{|Zs(fs)| - |Zs(fr)|}{Ro + |Zs(fr)|}\}$$
$$> \sqrt{a+1} \times \{1 + \frac{-|Zs(fr)|}{Ro + |Zs(fr)|}\}$$
$$> \sqrt{a+1} \times \{1 + (-\tfrac{1}{2})\} = \frac{\sqrt{a+1}}{2}$$

Since the gain a is by greater than 3,

Ratio′ > Ratio

Therefore the noise is suppressed by far considerably in the circuit shown in FIG. 5 (b) than in the circuit shown in FIG. 5 (a). That is, the noise in the vicinity of the frequency fr is more suppressed in the circuit FIG. 3 (a) than in the circuit shown at (b) in FIG. 1.

Referring back to FIG. 2 (b), while the output voltage vs. frequency characteristic curve for the circuit shown at (b) in FIG. 1 is 3, the preamplifier shown in FIG. 3 (a) has the characteristic curve 5 which shows that the noise is considerably suppressed in the vicinity of the frequency fr. Furthermore as shown in FIG. 2 (c) at 6, the noise is suppressed at its peaks in the upper and lower sidebands when the signal is made to pass through the limiter. Thus the S/N ratio may be remarkably improved after the frequency demodulation.

The preamplifier shown in FIG. 3 (b) is substantially similar in construction to the preamplifier shown in FIG. 3 (a) except that the first stage in the amplifier A is biased with a d-c voltage fed back through the resistor $R_1$ from the output terminal Tout of the amplifier A.

In general, in the amplifier A a predetermined d-c voltage is divided by resistors, and a divided voltage is supplied to the first stage. Therefore the voltage dividing resistors also become the noise source. To remove this noise source, not only the a-c component but also the bias voltage are negatively fed back from the output terminal Tout of the amplifier so that in addition to the noise from the resistor Ro, the noise from other sources may be effectively suppressed.

In the preamplifier shown in FIG. 3 (c), the method for supplying the first stage in the amplifier A with the d-c bias voltage is also modified based on the fact that the magnetic head exhibits almost no resistance to direct current. A d-c voltage $E_{DC}$ is divided by resistors $R_{B1}$ and $R_{B2}$, and the a-c component is by-passed to the ground through a capacitor $C_B$. Therefore a very stable d-c voltage may be supplied to the amplifier A through the magnetic head, whereby the noise in the bias voltage may be eliminated. Thus, the problems to be solved are the elimination of the noise produced from the magnetic head and the noise figure NF of the amplifier A.

In the embodiments shown in FIGS. 4 (a) and 4 (b), adverse effects due to the floating capacitance of the feedback resistor are eliminated. In the circuit shown in FIG. 3 (a), the resistor $R_1$ has a floating capacitance which is in parallel with the capacitance $C_H$ due to the so-called Miller effect. As a result, in order to obtain a desired resonance frequency fr, the capacitance $C_H$ must be reduced. In an extreme case, a negative capacitance is needed. The first reason is that the gain a of the amplifier A is very high because of the purpose of the provision of this preamplifier, and the second reason is that the floating capacitance of the feedback resistor may be high. Higher floating capacitance is due to the poor design of the resistors, and the variable resistors have in general higher floating capacitance than the fixed resistors.

In the preamplifier circuit shown in FIG. 4 (a), the output from the amplifier A is divided by resistors $R_3$ and $R_4$, and a divided voltage is fed back through a resistor $R_2$. An equivalent gain by this negative feedback is $$a \times \frac{R_4}{R_3 + R_4}$$

Therefore, the miller capacitance which is $$Cs \times (1+a)$$

becomes $$Cs \times (1 + a \times \frac{R_4}{R_3 + R_4})$$

That is, the miller capacitance is reduced. Since the values of the resistors $R_3$ and $R_4$ and the output impedance of the amplifier A are so small that their floating capacitance may be negligible.

The preamplifier shown in FIG. 4 (b) is substantially similar in construction to the preamplifier shown in FIG. 4 (a) except that instead of the resistors $R_3$ and $R_4$, a variable resistor $R_{VAR}$ is used. This arrangement is advantageous in that the negative feedback resistance may be arbitrarily selected. The output voltage from the amplifier A is divided by the variable resistor $R_{VAR}$ and a fixed negative feedback resistor $R_5$ so that a damping resistor equivalent to the combination of the variable and fixed resistors may be a variable resistor. Furthermore the floating resistance Cs′ of the fixed resistor $R_5$ is very low.

In summary, according to the present invention, the design of the preamplifiers may be so improved that the production of the preamplifiers may be much facilitated.

What is claimed is:

1. A preamplifier for amplifying, a low level angularly modulated signal reproduced from a magnetic recording medium, said signal having at least an upper sideband and a predetermined carrier frequency, comprising:

signal input means including a resonant circuit comprising the inductance of a magnetic head and a capacitor, the resonant frequency of said resonant circuit being equal to or higher than said carrier frequency;

an amplifier having an input terminal coupled to said signal input means, and an output terminal; and negative feedback circuit means including resistance means coupled between said input terminal and said output terminal for reducing the noise in said upper sideband at the output terminal of said amplifier gain of said amplifier in the vicinity of said resonant frequency.

2. A preamplifier as set forth in claim 1 wherein said amplifier includes a first amplifying device and means for supplying dc bias thereto through said resistance means.

3. A preamplifier as set forth in claim 1, further comprising a dc voltage source for supplying dc bias to the first amplifying device of said amplifier through said magnetic head.

4. A preamplifier for amplifying, a low level angularly modulated signal reproduced from a magnetic recording medium, said signal modulated signal having a predetermined carrier frequency, comprising:
   signal input means including a resonant circuit comprising the inductance of a magnetic head and a capacitor, the resonant frequency of said resonant circuit being equal to or higher than said carrier frequency;
   an amplifier having an input terminal coupled to said signal input means, and an output terminal;
   voltage dividing means having an input terminal coupled to said output terminal of said amplifier; and an output terminal to provide the divided voltage, the dividing ratio of said voltage dividing means being variable; and
   negative feedback circuit means including a fixed resistor coupled between said input terminal of said amplifier and said output terminal of said voltage dividing means for reducing the noise in the output of said amplifier in the upper sideband of said angularly modulated signal by reducing the gain of said amplifier in the vicinity of said resonant frequency, signal limiting and demodulating means coupled to said output terminal.

5. A preamplifier as set forth in claim 4, further comprising a dc voltage source for supplying dc bias to the first amplifying device of said amplifier through said magnetic head.

6. A preamplifier for amplifying a low level frequency modulated television signal reproduced from a magnetic recording tape by a video tape recorder, said signal having a predetermined carrier frequency and predetermined upper and lower frequency deviation limits, comprising:
   signal input means including a resonant circuit comprising the inductance of a magnetic head and a capacitor, the resonant frequency of said resonant circuit being equal to or higher than said carrier frequency;
   an amplifier having an input terminal coupled to said signal input means, and an output terminal; and
   a negative feedback circuit including resistance means coupled between said input terminal and said output terminal for reducing the noise in the output of said amplifier in the upper sideband of said frequency modulated signal by reducing the gain of said amplifier in the vicinity of said resonant frequency.

* * * * *